(12) United States Patent
Takamine

(10) Patent No.: US 11,558,072 B2
(45) Date of Patent: Jan. 17, 2023

(54) MULTIPLEXER

(71) Applicant: Murata Manufacturing Co., Ltd., Nagaokakyo (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 502 days.

(21) Appl. No.: 16/728,000

(22) Filed: Dec. 27, 2019

(65) Prior Publication Data

US 2020/0145030 A1 May 7, 2020

Related U.S. Application Data

(63) Continuation of application No. PCT/JP2018/025133, filed on Jul. 3, 2018.

(30) Foreign Application Priority Data

Jul. 5, 2017 (JP) .............................. JP2017-132058

(51) Int. Cl.
| | | |
|---|---|---|
| H03H 9/64 | (2006.01) | |
| H04B 1/00 | (2006.01) | |
| H03H 9/145 | (2006.01) | |
| H03H 9/60 | (2006.01) | |
| H03H 9/70 | (2006.01) | |

(52) U.S. Cl.
CPC ....... *H04B 1/0057* (2013.01); *H03H 9/14502* (2013.01); *H03H 9/605* (2013.01); *H03H 9/6483* (2013.01); *H03H 9/703* (2013.01)

(58) Field of Classification Search
CPC .......... H03H 9/6483; H03H 9/64; H03H 9/70; H03H 9/605; H03H 9/145; H03H 9/60; H03H 9/14502; H03H 9/703; H04B 1/0057; H04B 1/00; H04B 1/0067
See application file for complete search history.

(56) References Cited

U.S. PATENT DOCUMENTS

| | | |
|---|---|---|
| 2015/0070227 A1 | 3/2015 | Kishino et al. |
| 2018/0109243 A1 | 4/2018 | Takamine |
| 2018/0241373 A1 | 8/2018 | Yamada |

FOREIGN PATENT DOCUMENTS

| | | | | |
|---|---|---|---|---|
| EP | 1 003 287 A1 | 5/2000 | | |
| JP | 2012-147175 A | 8/2012 | | |
| JP | 2013-168692 A | 8/2013 | | |
| JP | 2013168692 | * 8/2013 | ............. | H03H 9/145 |
| WO | 99/65141 A1 | 12/1999 | | |
| WO | 2013/161881 A1 | 10/2013 | | |

(Continued)

OTHER PUBLICATIONS

Official Communication issued in International Patent Application No. PCT/JP2018/025133, dated Sep. 25, 2018.

*Primary Examiner* — Tuan H Nguyen

(74) *Attorney, Agent, or Firm* — Keating & Bennett, LLP

(57) ABSTRACT

A multiplexer includes acoustic wave filters that are electrically connected to a common connection terminal. In a first transmission-side filter of the acoustic wave filters, a series arm resonator closest to the common connection terminal includes acoustic wave resonators that are electrically connected in series and capacitance elements that are electrically connected between at least one of signal paths electrically connecting the acoustic wave resonators to each other and a reference terminal.

20 Claims, 11 Drawing Sheets

(56) References Cited

FOREIGN PATENT DOCUMENTS

| WO | 2014/167755 A1 | 10/2014 | |
| WO | WO 2014167755 | * 10/2014 | ............... H03H 9/64 |
| WO | 2016/208670 A1 | 12/2016 | |
| WO | 2017/073652 A1 | 5/2017 | |

* cited by examiner

MULTIPLEXER

CROSS REFERENCE TO RELATED APPLICATIONS

This application claims the benefit of priority to Japanese Patent Application No. 2017-132058 filed on Jul. 5, 2017 and is a Continuation Application of PCT Application No. PCT/JP2018/025133 filed on Jul. 3, 2018. The entire contents of each application are hereby incorporated herein by reference.

BACKGROUND OF THE INVENTION

1. Field of the Invention

The present invention relates to a multiplexer that includes an acoustic wave filter.

2. Description of the Related Art

In recent years, there is a need for a cellular phone that supports frequency bands and wireless systems, that is, a multi-band and a multi-mode. To fulfill the need, a multiplexer that separates radio-frequency signals having radio carrier frequencies is disposed right below an antenna. Band pass filters included in the multiplexer are acoustic wave filters each of which is characterized by a low loss in a pass band and steepness of a bandpass characteristic in a band near the pass band.

International Publication No. 2016/208670 discloses a surface acoustic wave device (SAW duplexer) in which surface acoustic wave filters are connected to a common antenna terminal.

In a surface acoustic wave filter having a piezoelectric layer, energy of a radio-frequency power is confined within the piezoelectric layer, and in some cases, a higher-order mode occurs at a frequency higher than a filter pass band. The occurrence of the higher-order mode increases a return loss. Accordingly, when the frequency at which the higher-order mode occurs is in the pass band of another surface acoustic wave filter that is connected to the antenna terminal, a ripple occurs in the pass band of the other surface acoustic wave filter, and an insertion loss is increased. Consequently, there is a problem in that the bandpass characteristic of the entire multiplexer is degraded.

SUMMARY OF THE INVENTION

Accordingly, preferred embodiments of the present invention provide multiplexers that can each reduce or prevent the bandpass characteristic from being degraded.

A multiplexer according to a preferred embodiment of the present invention transmits and receives radio-frequency signals via an antenna element and includes acoustic wave filters that are electrically connected to a common connection terminal electrically connected to the antenna element and that have respective pass bands different from each other. A first acoustic wave filter of the acoustic wave filters includes an input terminal, an output terminal, and at least one of a series arm resonator that is provided on a signal path electrically connecting the input terminal and the output terminal to each other, and a parallel arm resonator that is electrically connected between the signal path and a reference terminal. At least one of the series arm resonator closest to the common connection terminal and the parallel arm resonator closest to the common connection terminal includes acoustic wave resonators that are electrically connected in series, and a first capacitance element that is electrically connected between at least one of signal paths electrically connecting the acoustic wave resonators to each other and the reference terminal.

With this structure, a spurious wave that is emitted from the first acoustic wave filter at a frequency that is in the pass band of a second acoustic wave filter can be decreased or prevented. Consequently, the bandpass characteristic of the second acoustic wave filter whose pass band includes a frequency at which the spurious wave occurs in the first acoustic wave filter can be reduced or prevented from being degraded. Accordingly, the bandpass characteristic of the multiplexer can be reduced or prevented from being degraded.

The first acoustic wave filter may emit a spurious wave at a frequency that is in a pass band of a second acoustic wave filter of the acoustic wave filters that differs from the first acoustic wave filter.

With this structure, the spurious wave that is emitted from the first acoustic wave filter is decreased or prevented, and the bandpass characteristic of the second acoustic wave filter can be reduced or prevented from being degraded. Accordingly, the bandpass characteristic of the multiplexer can be reduced or prevented from being degraded.

The acoustic wave resonators may have the same or substantially the same resonator parameter.

Accordingly, resonators that are included in the series arm resonator or the parallel arm resonator closest to the common connection terminal are able to be readily provided.

A piezoelectric substrate included in the first acoustic wave filter may include a piezoelectric film including a surface on which an interdigital transducer electrode is provided, a high acoustic velocity support substrate through which a bulk wave is transmitted at an acoustic velocity higher than an acoustic velocity at which an acoustic wave is transmitted through the piezoelectric film, and a low acoustic velocity film that is provided between the high acoustic velocity support substrate and the piezoelectric film and through which a bulk wave is transmitted at an acoustic velocity lower than an acoustic velocity at which a bulk wave is transmitted through the piezoelectric film.

A piezoelectric substrate included in the first acoustic wave filter may be made of a $LiNbO_3$ piezoelectric single crystal substrate including a surface on which an interdigital transducer electrode is provided.

With this structure, the spurious wave is decreased or prevented, and the bandpass characteristic of the multiplexer can be reduced or prevented from being degraded, even when the acoustic wave filters likely to cause a ripple at a frequency of the higher-order mode of the resonant frequency of each resonator are provided.

A multiplexer according to a preferred embodiment of the present invention transmits and receives radio-frequency signals via an antenna element and includes acoustic wave filters that are electrically connected to a common connection terminal electrically connected to the antenna element and that have respective pass bands different from each other. A third acoustic wave filter of the acoustic wave filters includes an input terminal, an output terminal, and at least one of a series arm resonator that is provided on a signal path electrically connecting the input terminal and the output terminal to each other, and a parallel arm resonator that is electrically connected between the signal path and a reference terminal. At least one of the series arm resonator closest to the common connection terminal and the parallel arm resonator closest to the common connection terminal includes at least one acoustic wave resonator, and a second capacitance element that is electrically connected in parallel with the at least one acoustic wave resonator to bridge both end portions of the at least one acoustic wave resonator.

With this structure, a spurious wave that is emitted from the third acoustic wave filter at a frequency that is in the pass band of a fourth acoustic wave filter can be decreased or prevented by at least one resonator and at least one capacitance element being included in the series arm resonator or the parallel arm resonator adjacent to or in a vicinity of the common connection terminal. Consequently, the bandpass characteristic of the fourth acoustic wave filter whose pass band includes a frequency at which the spurious wave occurs in the third acoustic wave filter can be reduced or prevented from being degraded. Accordingly, the bandpass characteristic of the multiplexer can be reduced or prevented from being degraded.

The third acoustic wave filter may emit a spurious wave at a frequency that is in a pass band of a fourth acoustic wave filter of the acoustic wave filters that differs from the third acoustic wave filter.

With this structure, the spurious wave that is emitted from the third acoustic wave filter is decreased, and the bandpass characteristic of the fourth acoustic wave filter can be reduced or prevented from being degraded. Accordingly, the bandpass characteristic of the multiplexer can be reduced or prevented from being degraded.

A piezoelectric substrate included in the third acoustic wave filter may include a piezoelectric film including a surface on which an interdigital transducer electrode is provided, a high acoustic velocity support substrate through which a bulk wave is transmitted at an acoustic velocity higher than an acoustic velocity at which an acoustic wave is transmitted through the piezoelectric film, and a low acoustic velocity film that is provided between the high acoustic velocity support substrate and the piezoelectric film and through which a bulk wave is transmitted at an acoustic velocity lower than an acoustic velocity at which a bulk wave is transmitted through the piezoelectric film.

A piezoelectric substrate included in the third acoustic wave filter may be made of a $LiNbO_3$ piezoelectric single crystal substrate having a surface on which an interdigital transducer electrode is formed.

With this structure, the spurious wave is decreased, and the bandpass characteristic of the multiplexer can be reduced or prevented from being degraded, even when the acoustic wave filters likely to cause a ripple at a frequency of the higher-order mode of the resonant frequency of each resonator is provided.

Multiplexers according to preferred embodiments of the present invention can reduce or prevent the bandpass characteristic from being degraded.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
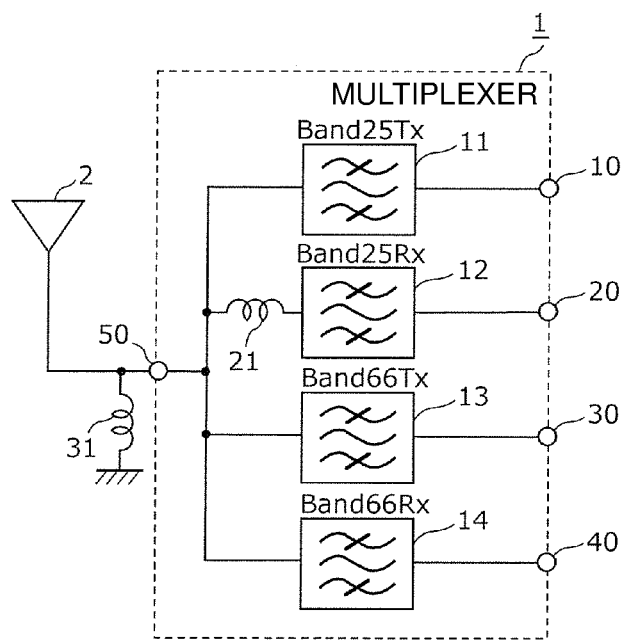
FIG. 1 is a circuit diagram of a multiplexer according to a first preferred embodiment of the present invention.

Preferred embodiments of the present invention will hereinafter be described in detail with reference to the drawings. The preferred embodiments described below are comprehensive or specific examples. In the following description according to the preferred embodiments, numerical values, shapes, materials, components, and the arrangement and connection structure of the components are described by way of example and do not limit the present invention. Among the components according to the preferred embodiments below, components that are not recited in the independent claims are described as arbitrary or optional components. In the drawings, the dimensions of the components and ratios of the dimensions are not necessarily shown strictly.

First Preferred Embodiment

1. Basic Structure of Multiplexer

According to a first preferred embodiment of the present invention, a quadplexer is described by way of example, and the quadplexer is used, for example, in Band25 (a transmission pass band of about 1850 MHz to about 1915 MHz, and a reception pass band of about 1930 MHz to about 1995 MHz) and in Band66 (a transmission pass band of about 1710 MHz to about 1780 MHz, and a reception pass band of about 2010 MHz to about 2200 MHz) of FDD-LTE (Frequency Division Duplex-Long Term Evolution) standard.

A multiplexer 1 according to the first preferred embodiment is a quadplexer in which a Band25 duplexer and a Band66 duplexer are electrically connected to each other via a common connection terminal 50.

FIG. 1 is a circuit diagram of the multiplexer 1 according to the first preferred embodiment. As shown in FIG. 1, the multiplexer 1 includes transmission-side filters 11 and 13, reception-side filters 12 and 14, an inductance element 21, the common connection terminal 50, transmission input terminals 10 and 30, and reception output terminals 20 and 40. The transmission-side filters 11 and 13 and the reception-side filters 12 and 14 are preferably surface acoustic wave filters. The multiplexer 1 is electrically connected to an antenna element 2 at the common connection terminal 50. An inductance element 31 is electrically connected between a signal path electrically connecting the common connection terminal 50 and the antenna element 2 to each other and the ground that corresponds to a reference terminal. The inductance element 31 may be electrically connected in series between the common connection terminal 50 and the antenna element 2. The multiplexer 1 may not include the inductance element 31. The inductance element 31 may be included in the multiplexer 1 or may be an external component of the multiplexer 1.

The transmission-side filter 11 is an unbalanced-input-unbalanced-output-type band pass filter that receives a transmission wave created by a transmission circuit (for example, a RFIC) via the transmission input terminal 10, filters the transmission wave in the transmission pass band (for example, about 1850 MHz to about 1915 MHz) of Band25, and outputs the filtered wave to the common connection terminal 50.

The reception-side filter 12 is an unbalanced-input-unbalanced-output band pass filter that receives a reception wave from the common connection terminal 50, filters the reception wave in the reception pass band (for example, about 1930 MHz to about 1995 MHz) of Band25, and outputs the filtered wave to the reception output terminal 20. The inductance element 21 is electrically connected in series between the reception-side filter 12 and the common connection terminal 50. As a result of the inductance element 21 being electrically connected to a side of the reception-side filter 12 closer to the common connection terminal 50, the impedances of the transmission-side filters 11 and 13 and the reception-side filter 14 are inductive. The pass bands of the transmission-side filters 11 and 13 and the reception-side filter 14 are outside the pass band of the reception-side filter 12. The multiplexer 1 may not include the inductance element 21 between the reception-side filter 12 and the common connection terminal 50.

The transmission-side filter 13 is an unbalanced-input-unbalanced-output band pass filter that receives a transmission wave created by a transmission circuit (for example, RFIC) via the transmission input terminal 30, filters the transmission wave in the transmission pass band (for example, about 1710 MHz to about 1780 MHz) of Band66, and outputs the filtered wave to the common connection terminal 50. In the multiplexer 1 according to the first preferred embodiment, the transmission-side filter 13 is a first acoustic wave filter.

The reception-side filter 14 is an unbalanced-input-unbalanced-output band pass filter that receives a reception wave from the common connection terminal 50, filters the reception wave in the reception pass band (for example, about 2010 MHz to about 2200 MHz) of Band66, and outputs the filtered wave to the reception output terminal 40. In the multiplexer 1 according to the first preferred embodiment, the reception-side filter 14 is a second acoustic wave filter.

The transmission-side filters 11 and 13 and the reception-side filters 12 and 14 each include at least one series arm resonator that is electrically connected in series with a signal path electrically connecting the corresponding input and output terminals to each other as described later, and at least one parallel arm resonator that is electrically connected between a signal path electrically connecting the input terminal and the output terminal to each other and the reference terminal (ground). The series arm resonator and the parallel arm resonator each include at least one resonator 100. The resonator 100 is a surface acoustic wave resonator.

The transmission-side filters 11 and 13 and the reception-side filters 12 and 14 are provided on respective piezoelectric substrates 5 described later. Each piezoelectric substrate 5 is mounted on a mounting substrate (not shown) on which the common connection terminal 50, the inductance elements 21 and 31, a wiring line, and another terminal are provided. More specifically, the piezoelectric substrate 5 is electrically connected to the wiring line that is provided on the mounting substrate by using, for example, solder. The transmission-side filters 11 and 13 and the reception-side filter 14 are directly electrically connected to the common connection terminal 50, and no element is provided therebetween. The reception-side filter 12 is electrically connected to the common connection terminal 50 with the inductance element 21 provided therebetween.

The inductance element 21 is not limited to being electrically connected between the reception-side filter 12 and the common connection terminal 50 and may be electrically connected in series between the reception-side filter 14 and the common connection terminal 50. The multiplexer 1 may not include the inductance element 21.

The transmission-side filters 11 and 13 and the reception-side filters 12 and 14 that are mounted on the mounting substrate are sealed with, for example, a thermosetting resin or an ultraviolet curable resin.

2. Structure of Surface Acoustic Wave Resonator

The structure of each resonator 100 that is included in the transmission-side filters 11 and 13 and the reception-side filters 12 and 14 will now be described.

Figure 2A:
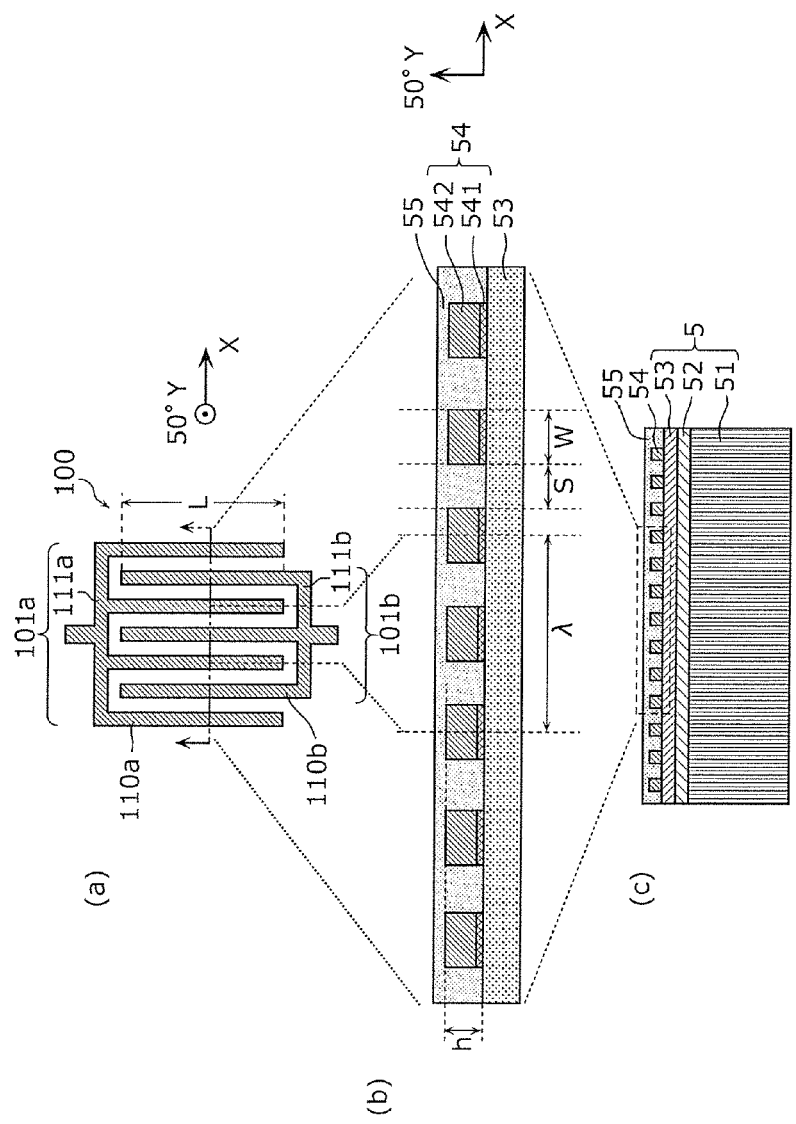
FIG. 2A shows a plan view and sectional views of an example of a resonator according to the first preferred embodiment of the present invention.

Part (a) of FIG. 2A shows a plan view of an example of each resonator 100 according to the first preferred embodiment, and parts (b) and (c) of FIG. 2A show sectional views thereof along a one-dot chain line shown at part (a). The plan view and the sectional views in FIG. 2A show the structure of the resonator 100 that is included in a series arm resonator 101 of the transmission-side filter 11 among the resonators included in the transmission-side filters 11 and 13 and the reception-side filters 12 and 14. The resonator 100 is shown in FIG. 2A to describe a typical structure of each of the resonators, and the number and the length of electrode fingers defining electrodes are not limited thereto.

Each resonator 100 includes the piezoelectric substrate 5 and interdigital transducer electrodes 101a and 101b that are in the form of a comb.

As shown in part (a) of FIG. 2A, a pair of the interdigital transducer electrodes 101a and 101b that face each other are provided on the piezoelectric substrate 5. The interdigital transducer electrode 101a includes electrode fingers 110a that are parallel or substantially parallel with each other, and a busbar electrode 111a that connects the electrode fingers 110a to each other. The interdigital transducer electrode 101b includes electrode fingers 110b that are parallel or substantially parallel with each other, and a busbar electrode 111b that connects the electrode fingers 110b to each other. The electrode fingers 110a and 110b extend in a direction perpendicular or substantially perpendicular to the X-axis direction.

As shown in part (b) of FIG. 2A, an interdigital transducer electrode 54 that includes the electrode fingers 110a and 110b and the busbar electrodes 111a and 111b has a multilayer structure including a close-contact layer 541 and a main electrode layer 542.

The close-contact layer 541 is a layer that significantly improves adhesion between the piezoelectric substrate 5 and the main electrode layer 542, and an example of the material thereof is Ti. The film thickness of the close-contact layer 541 is preferably, for example, about 12 nm.

An example of the material of the main electrode layer 542 is Al including 1% of Cu. The film thickness of the main electrode layer 542 is preferably, for example, about 162 nm.

A protective layer 55 covers the interdigital transducer electrodes 101a and 101b. The protective layer 55 is a layer that protects the main electrode layer 542 from external environment, adjusts frequency and temperature characteristics, and increases humidity resistance, and is preferably, for example, a film whose main component is silicon dioxide. The thickness of the protective layer 55 is preferably, for example, about 25 nm.

The materials of the close-contact layer 541, the main electrode layer 542, and the protective layer 55 are not limited to the above materials. The interdigital transducer electrode 54 may not have the above multilayer structure. The interdigital transducer electrode 54 may include, for example, a metal such as Ti, Al, Cu, Pt, Au, Ag, or Pd, or an alloy thereof. The interdigital transducer electrode 54 may include multilayer bodies of the above metal or alloy. The protective layer 55 may not be provided.

The multilayer structure of each piezoelectric substrate 5 will now be described.

As shown in part (c) of FIG. 2A, each piezoelectric substrate 5 includes a high acoustic velocity support substrate 51, a low acoustic velocity film 52, and a piezoelectric film 53. The high acoustic velocity support substrate 51, the low acoustic velocity film 52, and the piezoelectric film 53 are stacked in this order.

The piezoelectric film 53 is preferably made of, for example, a 50° Y-cut X-transmission $LiTaO_3$ piezoelectric single crystal or piezoelectric ceramics (lithium tantalate single crystal or ceramics that is cut along a plane whose normal coincides with an axis rotated 50° about the X-axis from the Y-axis, and a surface acoustic wave is transmitted in the X-axis direction through the single crystal or ceramics). The thickness of the piezoelectric film 53 is preferably, for example, about 600 nm. The piezoelectric film 53 that is made of, for example, a 42 to 45° Y-cut X-transmission $LiTaO_3$ piezoelectric single crystal or piezoelectric ceramics is preferably used for the transmission-side filter 13 and the reception-side filter 14.

The high acoustic velocity support substrate 51 supports the low acoustic velocity film 52, the piezoelectric film 53, and the interdigital transducer electrode 54. A bulk wave is transmitted through the high acoustic velocity support substrate 51 at an acoustic velocity higher than an acoustic velocity at which an acoustic wave, for example, a surface acoustic wave or a boundary wave is transmitted through the piezoelectric film 53. The high acoustic velocity support substrate 51 confines a surface acoustic wave in a portion at which the piezoelectric film 53 and the low acoustic velocity film 52 are stacked and preventing the surface acoustic wave from leaking downward from the high acoustic velocity support substrate 51. An example of the high acoustic velocity support substrate 51 is a silicon substrate, and the thickness thereof is preferably, for example, about 200 μm.

A bulk wave is transmitted through the low acoustic velocity film 52 at an acoustic velocity lower than an acoustic velocity at which a bulk wave is transmitted through the piezoelectric film 53, and the low acoustic velocity film 52 is provided between the piezoelectric film 53 and the high acoustic velocity support substrate 51. Because of this structure and a property of an acoustic wave whose energy concentrates on a substantially low acoustic velocity medium, the energy of a surface acoustic wave is reduced or prevented from leaking to the outside of the interdigital transducer electrode. An example of a main component of the low acoustic velocity film 52 is silicon dioxide, and the thickness thereof is preferably, for example, about 670 nm.

With the above multilayer structure of each piezoelectric substrate 5, a Q factor at a resonant frequency and an anti-resonant frequency can be greatly increased more than with an existing structure including a piezoelectric substrate in a single layer. That is, a surface acoustic wave resonator having a high Q factor can be provided, and a filter having a low insertion loss is able to be provided due to the use of the surface acoustic wave resonator.

Circuit elements, for example, an inductance element and a capacitance element, are added to provide impedance matching between the surface acoustic wave filters, such as a case where the inductance element 21 to provide impedance matching is electrically connected in series with the side of the reception-side filter 12 closer to the common connection terminal 50. Consequently, it is assumed that the Q factor of each resonator 100 equivalently decreases. However, even in this case, the above multilayer structure of each piezoelectric substrate 5 is able to maintain the Q factor of the resonator 100 at a high value.

The high acoustic velocity support substrate 51 may have a multilayer structure of a support substrate and a high acoustic velocity film through which a bulk wave is transmitted at an acoustic velocity higher than an acoustic velocity at which an acoustic wave, for example, a surface acoustic wave or a boundary wave, is transmitted through the piezoelectric film 53. In this case, examples of the material of the support substrate can include piezoelectric materials (for example, lithium tantalate, lithium niobate, and crystal), ceramics (for example, alumina, sapphire, magnesia, silicon nitride, aluminum nitride, silicon carbide, zirconia, cordierite, mullite, steatite, and forsterite), a dielectric (for example, glass), a semiconductor (for example, silicon and gallium nitride), and a resin. Examples of the material of the high acoustic velocity film can include various high acoustic velocity materials, for example, aluminum nitride, aluminum oxide, silicon carbide, silicon nitride, silicon oxynitride, DLC, diamond, a medium whose main component is one of these materials, and a medium whose main component is a mixture of these materials.

Figure 2B:
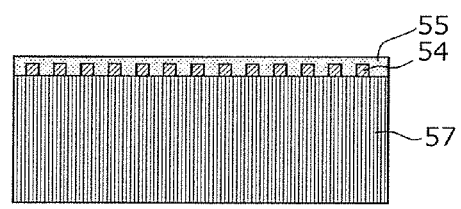
FIG. 2B shows a sectional view of another example of the resonator according to the first preferred embodiment of the present invention.

FIG. 2B shows a sectional view of another example of each resonator 100 according to the first preferred embodiment. The resonator 100 shown in FIG. 2A by way of example includes the interdigital transducer electrode 54 provided on the piezoelectric substrate 5 including the piezoelectric film 53. As shown in FIG. 2B, the substrate on which the interdigital transducer electrode 54 is provided may be a piezoelectric substrate 57 including a single piezoelectric layer. The piezoelectric substrate 57 is preferably made of, for example, a LiNbO$_3$ piezoelectric single crystal.

The substrate on which the interdigital transducer electrode 54 is provided may have a structure in which a support substrate, an energy-confining layer, and a piezoelectric film are stacked in this order. The interdigital transducer electrode 54 is provided on the piezoelectric film. Examples of the piezoelectric film include a LiTaO$_3$ piezoelectric single crystal or piezoelectric ceramics film. The support substrate supports the piezoelectric film, the energy-confining layer, and the interdigital transducer electrode.

The energy-confining layer is either a single layer or a multilayer, and a bulk acoustic wave is transmitted through at least one layer at a velocity higher than a velocity at which an acoustic wave is transmitted in a vicinity of the piezoelectric film. For example, a multilayer structure of a low-acoustic-velocity layer and a high-acoustic-velocity layer is also acceptable. The low acoustic velocity layer is a film, and a bulk wave is transmitted through the low acoustic velocity layer at an acoustic velocity lower than an acoustic velocity at which an acoustic wave is transmitted through the piezoelectric film. The high acoustic velocity layer is a film, and a bulk wave is transmitted through the high acoustic velocity layer at an acoustic velocity higher than an acoustic velocity at which an acoustic wave is transmitted through the piezoelectric film. The support substrate may be used as the high acoustic velocity layer.

The energy-confining layer may be an acoustic impedance layer that has a structure in which a low-acoustic-impedance layer the acoustic impedance of which is relatively low and a high-acoustic-impedance layer the acoustic impedance of which is relatively high are alternately stacked.

The multilayer structure, the material, the Cut-Angles, and the thickness of each of the piezoelectric film 53 and the piezoelectric substrate 57 may be appropriately changed in accordance with the bandpass characteristic of an acoustic wave filter device. Even when each resonator 100 is made of a LiTaO$_3$ piezoelectric substrate having Cut-Angles different from the above Cut-Angles, the same or similar advantageous effects as in the case of using the resonator 100 including the piezoelectric film 53 can be provided.

In parts (a) and (b) of FIG. 2A, A is the repetition pitch of the electrode fingers 110a and 110b that are included in the interdigital transducer electrodes 101a and 101b, L is the crossing width of the interdigital transducer electrodes 101a and 101b, W is the width of each of the electrode fingers 110a and 110b, S is a distance between each electrode finger 110a and the corresponding electrode finger 110b, and h is the height of each of the interdigital transducer electrodes 101a and 101b. Parameters that define the shape and size of each resonator 100 are referred to as resonator parameters, examples of which include the repetition pitch λ, the crossing width L, the width W of each electrode finger, the distance S between the electrode fingers, and the height h of each interdigital transducer electrode.

3. Structure of Acoustic Wave Filter

The circuit structure of each acoustic wave filter will now be described with reference to FIGS. 3A to 3D.

3-1. Circuit Structure of Transmission-Side Filter

Figure 3A:
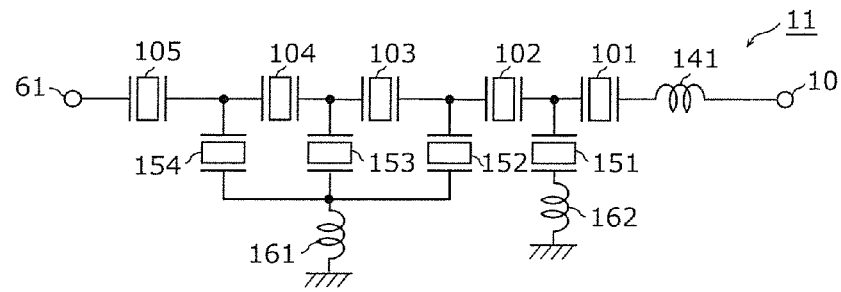
FIG. 3A is a circuit diagram of a transmission-side filter of Band25 that is included in the multiplexer according to the first preferred embodiment of the present invention.

FIG. 3A is a circuit diagram of the transmission-side filter 11 of Band25 that is included in the multiplexer 1 according to the first preferred embodiment. As shown in FIG. 3A, the transmission-side filter 11 includes series arm resonators 101 to 105, parallel arm resonators 151 to 154, and inductance elements 141, 161, and 162 to provide matching. The series arm resonators 101 to 105 and the parallel arm resonators 151 to 154 each include a corresponding resonator 100.

The series arm resonators 101 to 105 are electrically connected in series with each other to a signal path electrically connecting the transmission input terminal 10 and a transmission output terminal 61 to each other. The parallel arm resonators 151 to 154 are electrically connected in parallel with each other between the reference terminal (ground) and connection points of the transmission input terminal 10, the transmission output terminal 61, and the series arm resonators 101 to 105. With the above structure of connections between the series arm resonators 101 to 105 and the parallel arm resonators 151 to 154, the transmission-side filter 11 forms a ladder band pass filter.

The inductance element 141 is electrically connected in series between the transmission input terminal 10 and the series arm resonator 101. The inductance element 141 may be electrically connected between a signal path electrically connecting the transmission input terminal 10 and the series arm resonator 101 to each other and the reference terminal. The inductance element 141 is able to increase the isolation of the transmission-side filter 11 by using coupling between the inductance element 141 and the other inductance elements 161 and 162.

The inductance element 161 is electrically connected between a connection point of the parallel arm resonators 152, 153, and 154 and the reference terminal. The inductance element 162 is electrically connected between the parallel arm resonator 151 and the reference terminal.

The transmission output terminal 61 is electrically connected to the common connection terminal 50 (see FIG. 1). The transmission output terminal 61 is electrically connected to the series arm resonator 105 but is not directly electrically connected to the parallel arm resonators 151 to 154.

Figure 3B:
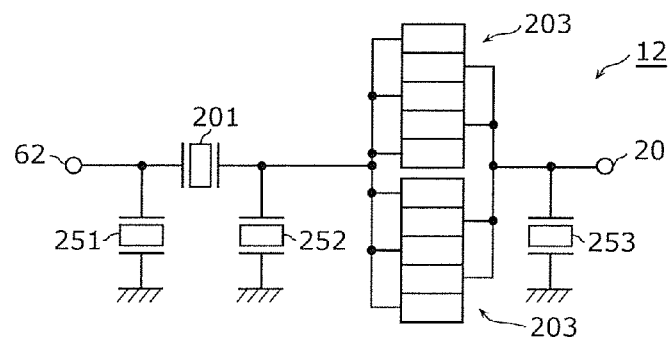
FIG. 3B is a circuit diagram of a reception-side filter of Band25 that is included in the multiplexer according to the first preferred embodiment of the present invention.
Figure 3C:
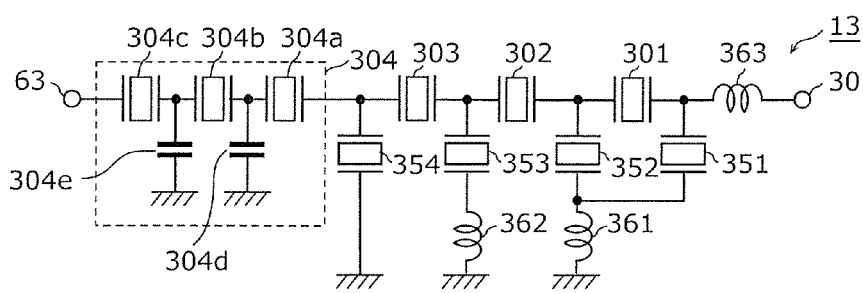
FIG. 3C is a circuit diagram of a transmission-side filter of Band66 that is included in the multiplexer according to the first preferred embodiment of the present invention.

FIG. 3C is a circuit diagram of the transmission-side filter 13 of Band66 that is included in the multiplexer 1 according to the first preferred embodiment. As shown in FIG. 3C, the transmission-side filter 13 includes series arm resonators 301 to 304, parallel arm resonators 351 to 354, and inductance elements 361 to 363 to provide matching.

The series arm resonators 301 to 303 and the parallel arm resonators 351 to 354 each include a corresponding resonator 100.

The series arm resonator 304 includes resonators 304a, 304b, and 304c, and capacitance elements 304d and 304e. The resonators 304a, 304b, and 304c are surface acoustic wave resonators and preferably have the same or substantially the same structure as each resonator 100 described above. The resonators 304a, 304b, and 304c preferably have the same or substantially the same resonator parameters. The meaning of "same" described herein includes minor manufacturing variances and errors that occur when the resonators 304a, 304b, and 304c are manufactured. According to the first preferred embodiment, the capacitance elements 304d and 304e are first capacitance elements.

The resonators 304a, 304b, and 304c are electrically connected in this order in series with a signal path electrically connecting the series arm resonator 303 and a transmission output terminal 63 to each other. The capacitance element 304d is electrically connected between a signal path electrically connecting the resonator 304a and the resonator 304b to each other and the reference terminal. The capacitance element 304e is electrically connected between a signal path electrically connecting the resonator 304b and the resonator 304c to each other and the reference terminal.

The capacitance elements 304d and 304e include, for example, respective interdigitation capacitances that have the same or substantially the same structure as each resonator 100. The capacitance elements 304d and 304e are not limited to the interdigitation capacitances and may have any suitable structure. For example, the capacitance element 304d may be defined such that a wiring line that is electrically connected to the reference terminal is provided adjacent to or in a vicinity of a wiring line that electrically connects the resonators 304a and 304b to each other. Similarly, the capacitance element 304e may be defined such that a wiring line that is electrically connected to the reference terminal is provided adjacent to or in a vicinity of a wiring line that electrically connects the resonators 304b and 304c to each other. The mounting substrate (not shown) on which the transmission-side filter 13 is mounted may include the capacitance elements 304d and 304e.

The series arm resonators 301 to 304 are electrically connected in series with each other to a signal path electrically connecting the transmission input terminal 30 and the transmission output terminal 63 to each other. The parallel arm resonators 351 to 354 are electrically connected in parallel with each other between the reference terminal and connection points of the transmission input terminal 30, the transmission output terminal 63, and the series arm resonators 301 to 304. With the above structure of connections between the series arm resonators 301 to 304 and the parallel arm resonators 351 to 354, the transmission-side filter 13 define a ladder band pass filter.

The inductance element 361 is electrically connected between a connection point of the parallel arm resonators 351 and 352 and the reference terminal. The inductance element 362 is electrically connected between the parallel arm resonator 353 and the reference terminal. The inductance element 363 is electrically connected between the transmission input terminal 30 and the series arm resonator 301. The inductance element 363 may be electrically connected in parallel with the transmission input terminal 30, that is, may be electrically connected between a signal path electrically connecting the transmission input terminal 30 and the series arm resonator 301 to each other and the reference terminal.

The transmission output terminal 63 is electrically connected to the common connection terminal 50 (see FIG. 1). The transmission output terminal 63 is electrically connected to the series arm resonator 304 but is not directly connected to the parallel arm resonators 351 to 354.

Figure 4:
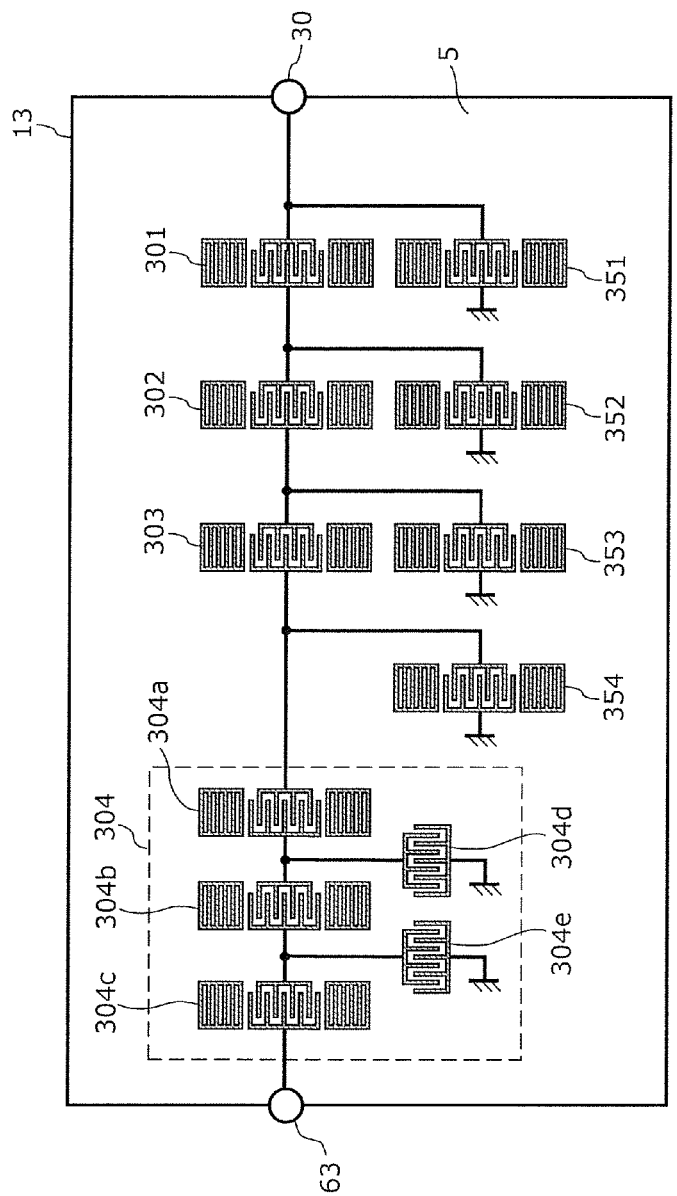
FIG. 4 shows a plan view of an example of arrangement of resonators of the transmission-side filter of Band66 that is included in the multiplexer according to the first preferred embodiment of the present invention.

FIG. 4 shows a plan view of an example of an arrangement of the resonators of the transmission-side filter 13 of Band66 that is included in the multiplexer 1 according to the first preferred embodiment.

As shown in FIG. 4, in the transmission-side filter 13, each resonator 100 that is included in the series arm resonators 301 to 303 and the parallel arm resonators 351 to 354, and the resonators 304a to 304c that are included in the series arm resonator 304 are provided on the piezoelectric substrate 5 such that surface acoustic waves are transmitted through each resonator 100 that is included in the series arm resonators 301 to 303 and the parallel arm resonators 351 to 354, and the resonator 304a to 304c in the same or substantially the same direction. Each resonator 100 that is included in the series arm resonators 301 to 303 and the parallel arm resonators 351 to 354, and the resonators 304a to 304c includes reflectors on both sides of the interdigital transducer electrode in the direction in which surface acoustic waves are transmitted.

As shown in FIG. 4, the capacitance elements 304d and 304e that include the respective interdigitation capacitances are arranged on the piezoelectric substrate 5 in the direction perpendicular or substantially perpendicular to the direction of the interdigital transducer electrode of each resonator 100 that is included in the series arm resonators 301 to 303 and the parallel arm resonators 351 to 354, and the resonators 304a to 304c. Accordingly, the capacitance elements 304d and 304e are able to define and function as the capacitance elements and no surface acoustic waves are transmitted through the capacitance elements 304d and 304e that even include the interdigitation capacitances. The magnitude of the capacitance of the capacitance elements 304d and 304e is preferably, for example, about 0.5 pF.

3-2. Circuit Structure of Reception-Side Filter

FIG. 3B is a circuit diagram of the reception-side filter 12 of Band25 that is included in the multiplexer 1 according to the first preferred embodiment. As shown in FIG. 3B, the reception-side filter 12 includes, for example, a longitudinally coupled surface acoustic wave filter. More specifically, the reception-side filter 12 includes a longitudinally coupled filter 203, a series arm resonator 201, and parallel arm resonators 251 to 253. The series arm resonator 201 and the parallel arm resonators 251 to 253 each include the corresponding resonator 100.

Figure 5:
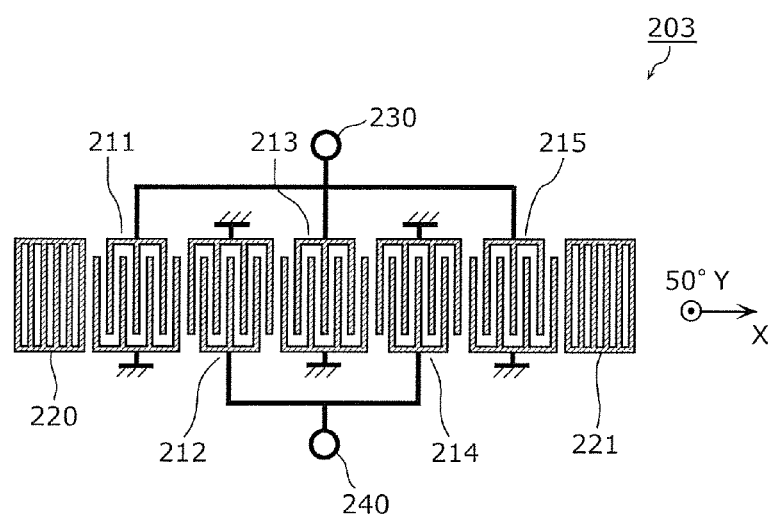
FIG. 5 is a plan view of electrodes of a longitudinally coupled surface acoustic wave filter according to the first preferred embodiment of the present invention.

FIG. 5 is a plan view of electrodes of the longitudinally coupled filter 203 according to the first preferred embodiment. As shown in FIG. 5, the longitudinally coupled filter 203 includes interdigital transducers 211 to 215, reflectors 220 and 221, an input port 230, and an output port 240.

Each of the interdigital transducers 211 to 215 includes a pair of interdigital transducer electrodes that face each other. The interdigital transducer 213 is provided between the interdigital transducers 212 and 214 in the X-axis direction.

The interdigital transducers 212 to 214 are provided between the interdigital transducers 211 and 215 in the X-axis direction. The interdigital transducers 211 to 215 are provided between the reflectors 220 and 221 in the X-axis direction. The interdigital transducers 211, 213, and 215 are electrically connected in parallel between the input port 230 and the reference terminal. The interdigital transducers 212 and 214 are electrically connected in parallel between the output port 240 and the reference terminal.

As shown in FIG. 3B, the series arm resonator 201 and the parallel arm resonators 251 and 252 define a ladder filter.

A reception input terminal 62 is electrically connected to the common connection terminal 50 (see FIG. 1) with the inductance element 21 (see FIG. 1) provided therebetween. As shown in FIG. 3B, the reception input terminal 62 is electrically connected to the parallel arm resonator 251.

Figure 3D:
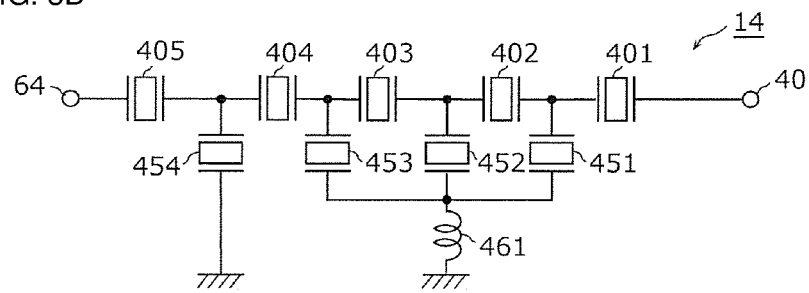
FIG. 3D is a circuit diagram of a reception-side filter of Band66 that is included in the multiplexer according to the first preferred embodiment of the present invention.

FIG. 3D is a circuit diagram of the reception-side filter 14 of Band66 that is included in the multiplexer 1 according to the first preferred embodiment. As shown in FIG. 3D, the reception-side filter 14 includes series arm resonators 401 to 405, parallel arm resonators 451 to 454, and an inductance element 461 to provide matching. The series arm resonators 401 to 405 and the parallel arm resonators 451 to 454 each include the corresponding resonator 100.

The series arm resonators 401 to 405 are electrically connected in series with each other between the reception output terminal 40 and a reception input terminal 64. The parallel arm resonators 451 to 454 are electrically connected in parallel with each other between the reference terminal (ground) and connection points of the reception output terminal 40, the reception input terminal 64, and the series arm resonators 401 to 405. With the above structure of connections between the series arm resonators 401 to 405 and the parallel arm resonators 451 to 454, the reception-side filter 14 forms a ladder band pass filter. The inductance element 461 is electrically connected between a connection point of the parallel arm resonators 451, 452, and 453 and the reference terminal.

The reception input terminal 64 is electrically connected to the common connection terminal 50 (see FIG. 1). As shown in FIG. 3D, the reception input terminal 64 is electrically connected to the series arm resonator 405, but is not directly electrically connected to the parallel arm resonator 454.

The arrangement of the resonators and the circuit elements of the surface acoustic wave filters included in the multiplexer 1 according to the first preferred embodiment is not limited to the arrangement of the transmission-side filters 11 and 13 and the reception-side filters 12 and 14 described according to the first preferred embodiment by way of example. The arrangement of the resonators and the circuit elements of the surface acoustic wave filters may be changed in accordance with the specification of the bandpass characteristic in each frequency band (Band). The term "arrangement" represents, for example, the number of the series arm resonators and the parallel arm resonators and selection of a filter structure, for example, a ladder filter structure or a longitudinally coupled filter structure.

4. Operating Principle of Surface Acoustic Wave Filter

The operating principle of a ladder surface acoustic wave filter according to the first preferred embodiment will now be described.

Each resonator 100 that is included in the parallel arm resonators 151 to 154 shown in, for example, FIG. 3A has a resonant frequency frp and an anti-resonant frequency fap (>frp) as the resonance characteristics. Each resonator 100 that is included in the series arm resonators 101 to 105 has a resonant frequency frs and an anti-resonant frequency fas (>frs>frp) as the resonance characteristics. Each resonator 100 that is included in the series arm resonators 101 to 105 is designed to have the same or substantially the same resonant frequency frs but does not necessarily have the same or substantially the same resonant frequency frs. The anti-resonant frequency fas of each resonator 100 that is included in the series arm resonators 101 to 105, the resonant frequency frp of each resonator 100 that is included in the parallel arm resonators 151 to 154, and the anti-resonant frequency fap of each resonator 100 that is included in the parallel arm resonators 151 to 154 have the same or similar features, and these resonators do not necessarily have the same resonant frequency and the same anti-resonant frequency.

In the case where a band pass filter includes a ladder resonator, the anti-resonant frequency fap of each resonator 100 that is included in the parallel arm resonators 151 to 154 approximates the resonant frequency frs of each resonator 100 that is included in the series arm resonators 101 to 105. Consequently, a lower stopband is approximately the resonant frequency frp at which the impedance of each resonator 100 that is included in the parallel arm resonators 151 to 154 is about 0. When the frequency increases to more than this, the impedance of each resonator 100 that is included in the parallel arm resonators 151 to 154 increases at or in a vicinity of the anti-resonant frequency fap, and the impedance of each resonator 100 that is included in the series arm resonators 101 to 105 is about 0 at or in a vicinity of the resonant frequency frs. Thus, a signal passband on a signal path from the transmission input terminal 10 to the transmission output terminal 61 is at or in a vicinity of the anti-resonant frequency fap to the resonant frequency frs. When the frequency further increases to approximately the anti-resonant frequency fas, which is a higher stopband, the impedance of each resonator 100 that is included in the series arm resonators 101 to 105 increases. That is, the steepness of the attenuation characteristics in the higher stopband is greatly affected depending on the anti-resonant frequency fas of each resonator 100 that is included in the series arm resonators 101 to 105 that is set to a frequency outside the signal passband.

When a radio-frequency signal is inputted into the transmission-side filter 11 from the transmission input terminal 10, an electric potential difference is generated between the transmission input terminal 10 and the reference terminal. Consequently, the piezoelectric substrate 5 warps, and a surface acoustic wave is created and transmitted in the X-direction. When the repetition pitch A of the interdigital transducer electrodes 101*a* and 101*b* substantially matches the wave length of the pass band, a radio-frequency signal having a frequency component to be passed alone passes through the transmission-side filter 11.

A ratio of a difference between the resonant frequency and the anti-resonant frequency of each resonator 100 to the resonant frequency is referred to as a resonant fractional bandwidth. For example, the resonant fractional bandwidth of the resonator 100 that is included in the series arm resonator 101 can be expressed as |fas−frs|/frs.

5. Radio-Frequency Transmission Characteristics of Multiplexer

Figure 6:
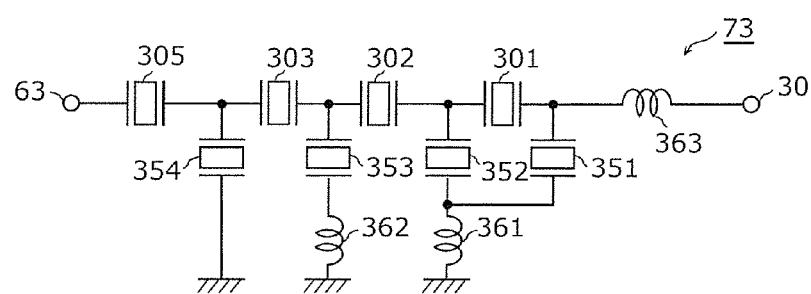
FIG. 6 is a circuit diagram of a transmission-side filter of Band66 that is included in a multiplexer according to a comparative example.

The radio-frequency transmission characteristics of the multiplexer 1 according to the first preferred embodiment will now be described and compared with the radio-frequency transmission characteristics of a multiplexer in a comparative example. FIG. 6 is a circuit diagram of a transmission-side filter 73 of Band66 that is included in the multiplexer according to the comparative example.

As shown in FIG. 6, the transmission-side filter 73 in the comparative example includes the series arm resonators 301 to 303, a series arm resonator 305, the parallel arm resonators 351 to 354, and the inductance elements 361 to 363. The structures of the series arm resonators 301 to 303, the parallel arm resonators 351 to 354, and the inductance elements 361 to 363 are the same or substantially the same as those of the series arm resonators 301 to 303, the parallel arm resonators 351 to 354, and the inductance elements 361 to 363 of the transmission-side filter 13 according to the first preferred embodiment. A difference from the series arm resonator 304 of the transmission-side filter 13 according to the first preferred embodiment is that the series arm resonator 305 closest to the common connection terminal 50 includes the single resonator 100. The transmission-side filter 73 has the same or similar structure to the transmission-side filter 13 except for the series arm resonator 305 although the resonator parameters of the resonator 100 that is included in the transmission-side filter 13 are slightly changed to provide matching of in-band characteristics to define and function as the transmission-side filter of Band66.

In the multiplexer that includes the transmission-side filter 73 of Band66, a spurious wave (higher-order mode) is emitted from the transmission-side filter 73 at a frequency that is in the pass band of the reception-side filter 14 of Band66. This causes a problem in that the bandpass characteristic of the reception-side filter 14 that is electrically connected to the transmission-side filter 73 at the common connection terminal 50 is degraded. The transmission-side filter 13 that has the same or similar structure to the transmission-side filter 73 also has a problem in that a spurious wave (higher-order mode) is emitted at a frequency that is in the pass band of the reception-side filter 14 of Band66 as in the transmission-side filter 73. However, the multiplexer that includes the transmission-side filter 13 can reduce the effect of the spurious wave on the reception-side filter 14 as described below.

Figure 7A:
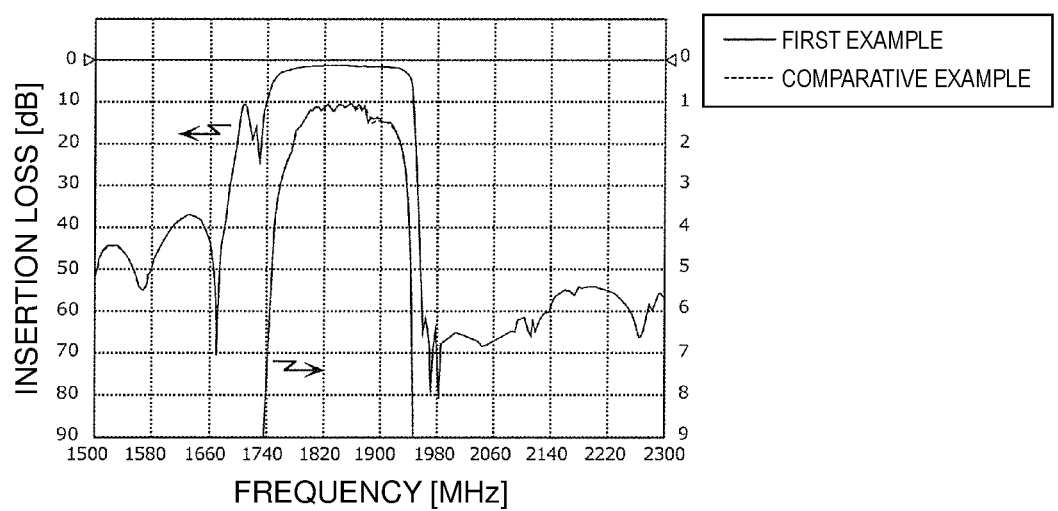
FIG. 7A is a graph in which the bandpass characteristic of the transmission-side filter of Band25 is compared between the first preferred embodiment of the present invention and the comparative example.
Figure 7B:
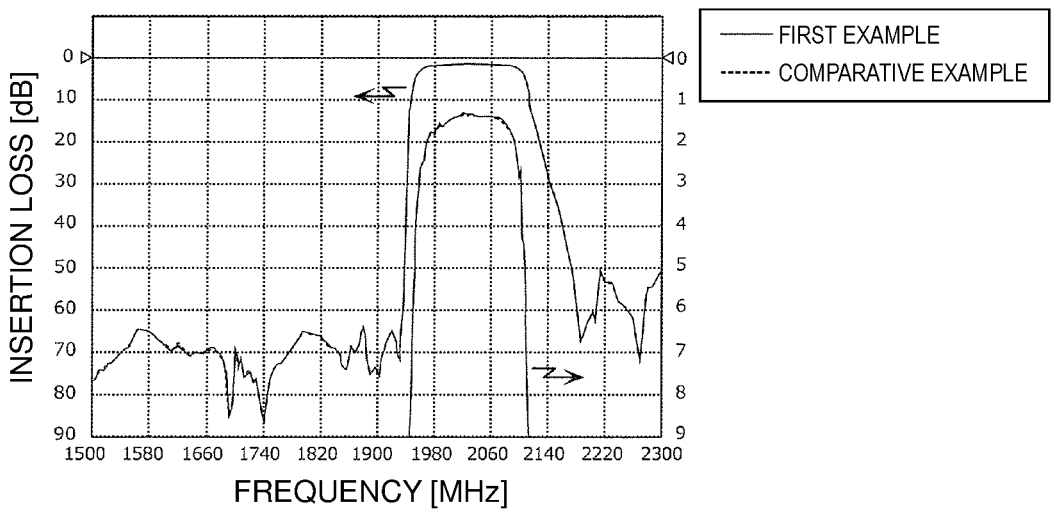
FIG. 7B is a graph in which the bandpass characteristic of the reception-side filter of Band25 is compared between the first preferred embodiment of the present invention and the comparative example.
Figure 7C:
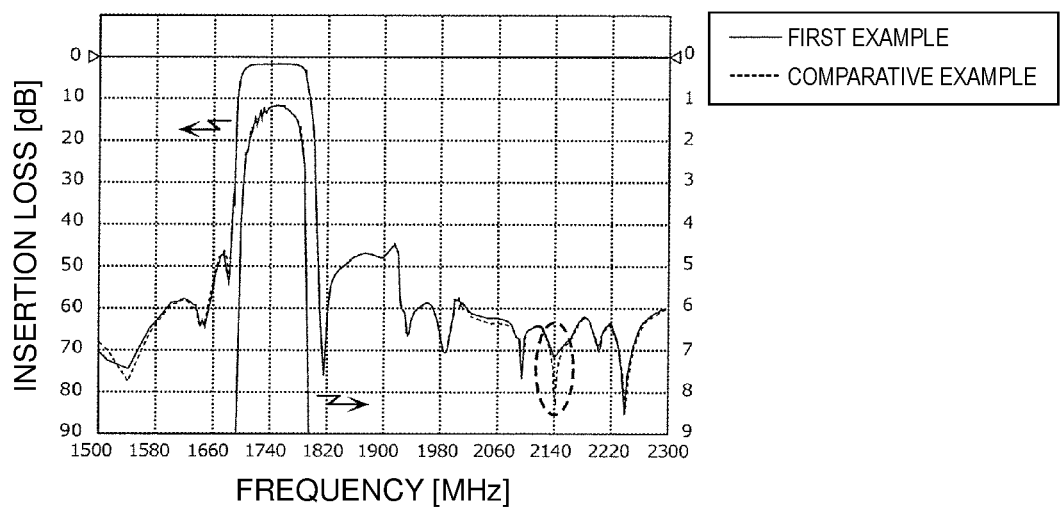
FIG. 7C is a graph in which the bandpass characteristic of the transmission-side filter of Band66 is compared between the first preferred embodiment of the present invention and the comparative example.
Figure 7D:
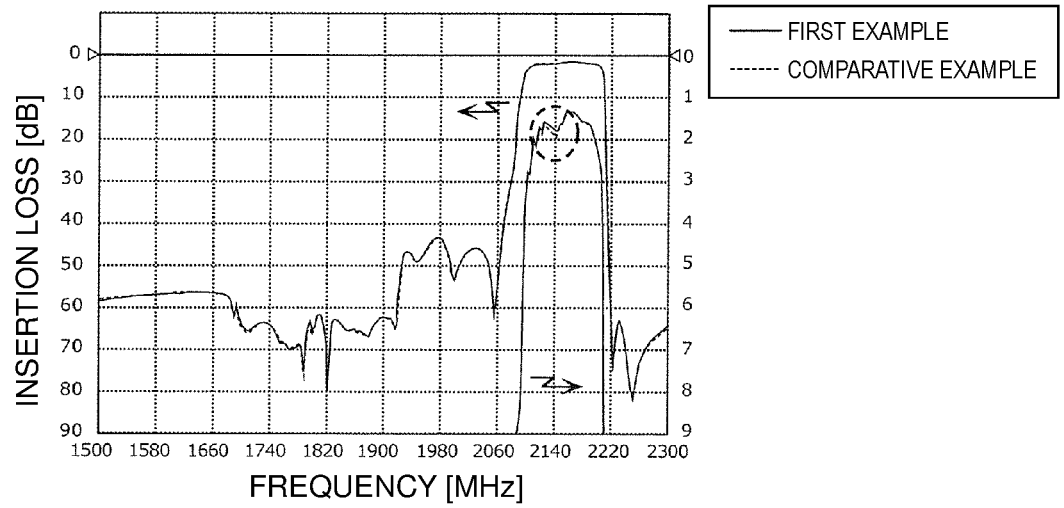
FIG. 7D is a graph in which the bandpass characteristic of the reception-side filter of Band66 is compared between the first preferred embodiment of the present invention and the comparative example.

FIG. 7A is a graph in which the bandpass characteristic of the transmission-side filter 11 of Band25 is compared between the first preferred embodiment and the comparative example. FIG. 7B is a graph in which the bandpass characteristic of the reception-side filter 12 of Band25 is compared between the first preferred embodiment and the comparative example. FIG. 7C is a graph in which the bandpass characteristic of the transmission-side filter 13 of Band66 is compared between the first preferred embodiment and the comparative example. FIG. 7D is a graph in which the bandpass characteristic of the reception-side filter 14 of Band66 is compared between the first preferred embodiment and the comparative example. In FIGS. 7A to 7D, the transmission characteristics of each filter when the transmission-side filter 13 according to the first preferred embodiment is used are shown as a first example, and the transmission characteristics of each filter when the transmission-side filter 73 in the comparative example is used are shown as the comparative example.

In FIG. 7A, the insertion loss of the transmission-side filter 11 of Band25 in the first example is compared with the insertion loss thereof in the comparative example. There is little difference in the magnitude of the insertion loss between the first example and the comparative example at about 1850 MHz to about 1915 MHz, which corresponds to the pass band of the transmission-side filter 11.

In FIG. 7B, the insertion loss of the reception-side filter 12 of Band25 in the first example is compared with the insertion loss thereof in the comparative example. There is little difference in the magnitude of the insertion loss between the first example and the comparative example at about 1930 MHz to about 1995 MHz, which corresponds to the pass band of the reception-side filter 12.

In FIG. 7C, the insertion loss of the transmission-side filter 13 of Band66 in the first example is compared with the insertion loss thereof in the comparative example. There is little difference in the magnitude of the insertion loss between the first example and the comparative example at about 1710 MHz to about 1780 MHz, which corresponds to the pass band of the transmission-side filter 13. The insertion loss in the first example is lower than that in the comparative example at or in a vicinity of about 2000 MHz to about 2100 MHz, which is outside of the pass band of the transmission-side filter 13. As shown in a region surrounded by a dashed line in FIG. 7C, the insertion loss in the first example is lower than that in the comparative example at or in a vicinity of about 2130 MHz to about 2150 MHz, which is outside the pass band of the transmission-side filter 13.

In FIG. 7D, the insertion loss of the reception-side filter 14 of Band66 in the first example is compared with the insertion loss thereof in the comparative example. As shown in a region surrounded by a dashed line in FIG. 7D, the insertion loss in the first example is lower than that in the comparative example at or in a vicinity of about 2110 MHz to about 2140 MHz, which is in a pass band of about 2010 MHz to about 2200 MHz of the reception-side filter 14, and the bandpass characteristic is significantly improved.

That is, according to the first preferred embodiment, the insertion loss of the transmission-side filter 13 of the multiplexer 1 at or in a vicinity of about 2130 MHz to about 2150 MHz is significantly improved, and the bandpass characteristic of the reception-side filter 14 that is electrically connected to the transmission-side filter 13 at the common connection terminal 50 at or in a vicinity of about 2110 MHz to about 2140 MHz is significantly improved. The reason will now be described.

Figure 8A:
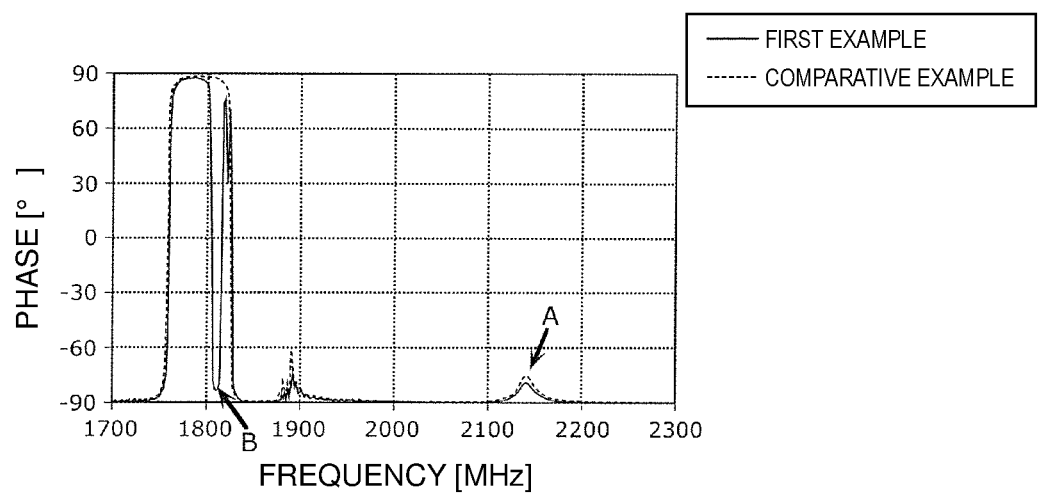
FIG. 8A is a graph in which the phase of a series arm resonator closest to a common connection terminal in the reception-side filter of Band66 is compared between the first preferred embodiment of the present invention and the comparative example.
Figure 8B:
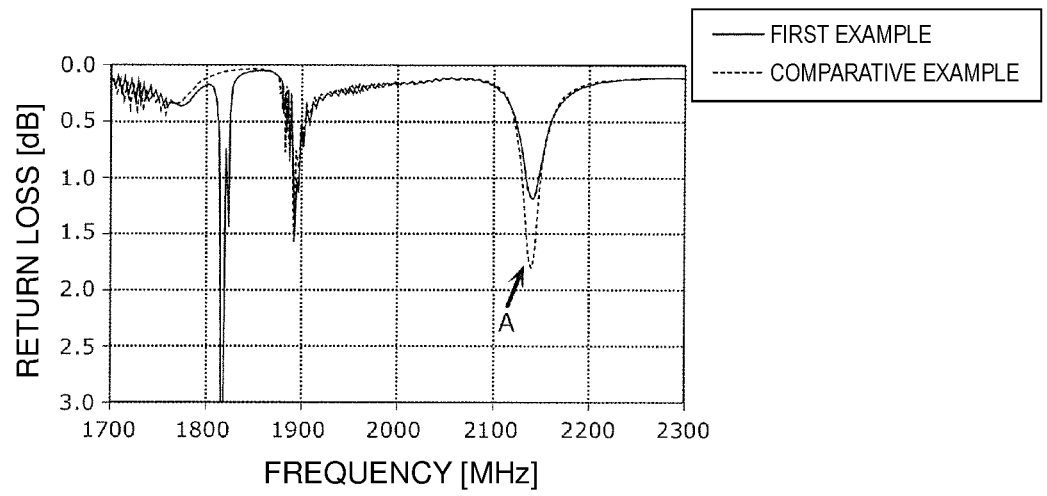
FIG. 8B is a graph in which the return loss of the series arm resonator closest to the common connection terminal in the reception-side filter of Band66 is compared between the first preferred embodiment of the present invention and the comparative example.

FIG. 8A is a graph in which the phases of the series arm resonators 304 and 305 according to the first preferred embodiment and the comparative example are compared. FIG. 8B is a graph in which the return losses of the series arm resonators 304 and 305 according to the first preferred embodiment and the comparative example are compared. In FIGS. 8A and 8B, the result of the series arm resonator 304 of the transmission-side filter 13 according to the first preferred embodiment is shown as the first example, and the result of the series arm resonator 305 in the comparative example is shown as the comparative example.

As shown by an arrow A in FIG. 8A, both of the phases in the first example and the comparative example have a local maximum point due to the spurious wave (higher-order mode) of the series arm resonator 304 at or in a vicinity of about 2140 MHz that is in the pass band of the reception-side filter 14. The variation in the phase of the series arm resonator 304 in the first example is smaller than that of the series arm resonator 305 in the comparative example.

Similarly, as shown by an arrow A in FIG. 8B, both of the return losses in the first example and the comparative example have a local minimum point due to the spurious wave (higher-order mode) of the series arm resonator 304 at or in a vicinity of about 2140 MHz that is in the pass band of the reception-side filter 14. The return loss of the series arm resonator 304 in the first example is lower than that of the series arm resonator 305 in the comparative example. The reason is that the use of the series arm resonator 304 instead of the series arm resonator 305 decreases the resonant fractional bandwidth in the higher-order mode of the series arm resonator 304. Consequently, the return loss of the transmission-side filter 13 at the transmission output terminal 63 in the pass band of the reception-side filter 14 is lower than the return loss of the transmission-side filter 73 at the transmission output terminal 63 in the pass band of the reception-side filter 14. Accordingly, the effect of the spurious wave (higher-order mode) of the series arm resonator 304 on the reception-side filter 14 is reduced, and the bandpass characteristic of the reception-side filter 14 is reduced or prevented from being degraded.

When the structure of the series arm resonator closest to the common connection terminal 50 is the same or substantially the same as that of the series arm resonator 304 in the transmission-side filter 13, as shown by an arrow B in FIG. 8A, a ripple of the phase occurs at or in a vicinity of about 1820 MHz, which is in the main mode of the resonant frequency of the series arm resonator 304. Consequently, it can be seen that the resonant fractional bandwidth at a frequency in the main mode of the resonant frequency decreases. The pass band width of the transmission-side filter 13 typically decreases as the resonant fractional bandwidth at the frequency in the main mode of the resonant frequency decreases, and the insertion loss is increased in the pass band of the transmission-side filter 13. In the transmission-side filter 13 according to the first preferred embodiment, however, the capacitance elements 304d and 304e are included only in the series arm resonator 304 closest to the common connection terminal 50. Accordingly, the bandpass characteristic of the transmission-side filter 13 can be reduced or prevented from being degraded by adjusting the resonator parameters of each resonator 100 that is included in the series arm resonators 301 to 303. Consequently, the multiplexer 1 can inhibit the bandpass characteristic of the reception-side filter 14 from being degraded, and the bandpass characteristic of the transmission-side filter 13 is not degraded.

6. Summary

In the multiplexer 1 according to the first preferred embodiment, the transmission-side filters 11 and 13 and the reception-side filters 12 and 14, which are acoustic wave filters, are electrically connected to the common connection terminal 50. In the transmission-side filter 13, which is one of the acoustic wave filters, the resonators 304a to 304c and the capacitance elements 304d and 304e are included in the series arm resonator 304 closest to the common connection terminal 50. The resonators 304a to 304c are electrically connected in series with the signal path electrically connecting the series arm resonator 303 and the transmission output terminal 63 to each other. The capacitance element 304d is electrically connected between the signal path electrically connecting the resonators 304a and 304b to each other and the reference terminal. The capacitance element 304e is electrically connected between the signal path electrically connecting the resonators 304b and 304c to each other and the reference terminal.

With this structure, the spurious wave that is emitted from the transmission-side filter 13 at a frequency that is in the pass band of the reception-side filter 14, which is another acoustic wave filter that is electrically connected to the transmission-side filter 13 at the common connection terminal 50, can be decreased. Consequently, the bandpass characteristic of the reception-side filter 14 whose pass band includes a frequency at which a ripple occurs in the transmission-side filter 13 can be reduced or prevented from being degraded. A loss in the pass band of the transmission-side filter 13 is not increased. Losses in the pass bands of the transmission-side filter 11 and the reception-side filter 12 other than the transmission-side filter 13 and the reception-side filter 14 are not increased. Accordingly, the bandpass characteristic of the multiplexer 1 can be reduced or prevented from being degraded.

First Modification to First Preferred Embodiment

Figure 9:
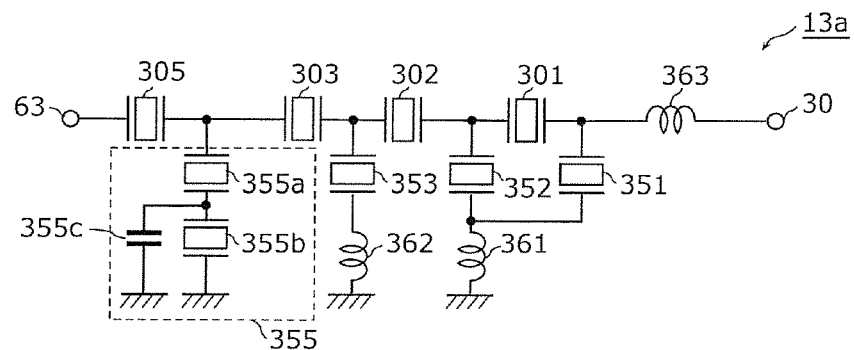
FIG. 9 is a circuit diagram of a transmission-side filter of Band66 that is included in a multiplexer according to a first modification to the first preferred embodiment of the present invention.

FIG. 9 is a circuit diagram of a transmission-side filter 13a of Band66 that is included in a multiplexer according to a first modification to the first preferred embodiment. The multiplexer according to the present modification differs from the multiplexer 1 according to the first preferred embodiment in that, in the transmission-side filter 13a, a parallel arm resonator closest to the common connection terminal 50 includes resonators and a capacitance element.

As shown in FIG. 9, the transmission-side filter 13a includes the series arm resonators 301 to 303 and 305, the parallel arm resonators 351 to 353, a parallel arm resonator 355, and the inductance elements 361 to 363 to provide matching.

The structures of the series arm resonators 301 to 303, the parallel arm resonators 351 to 353, and the inductance elements 361 to 363 are the same or substantially the same as those of the series arm resonators 301 to 303, the parallel arm resonators 351 to 353, and the inductance elements 361 to 363 described according to the first preferred embodiment. The structure of the series arm resonator 305 is the same or substantially the same as the structure of the series arm resonator 305 in the comparative example as described according to the first preferred embodiment.

The parallel arm resonator 355 includes resonators 355a and 355b and a capacitance element 355c. The resonators 355a and 355b are preferably surface acoustic wave resonators and have the same or substantially the same structure as each resonator 100 described above. The resonators 355a and 355b have the same or substantially the same resonator parameters as each other. According to the first modification of the first preferred embodiment, the capacitance element 355c is the first capacitance element.

The resonators 355a and 355b are electrically connected in this order in series between a signal path electrically connecting the series arm resonators 303 and 305 to each other and the ground. The capacitance element 355c is electrically connected between a signal path electrically connecting the resonator 355a and the resonator 355b to each other and the reference terminal.

The capacitance element 355c includes an interdigitation capacitance that has the same or substantially the same structure as, for example, each resonator 100 as described later. The capacitance element 355c is not limited to the interdigitation capacitance and may have any suitable structure. For example, the capacitance element 355c may be defined by a wiring line that is electrically connected to the reference terminal being provided adjacent to or in a vicinity of a wiring line that electrically connects the resonators 355a and 355b to each other. A mounting substrate (not shown) on which the transmission-side filter 13a is mounted may include the capacitance element 355c.

With this structure, the bandpass characteristic of the reception-side filter 14 can be reduced or prevented from being degraded, and the loss in the pass band of the transmission-side filter 13a is not increased as in the multiplexer 1 according to the first preferred embodiment.

Accordingly, the bandpass characteristic of the multiplexer can be reduced or prevented from being degraded.

Second Modification to First Preferred Embodiment

Figure 10:
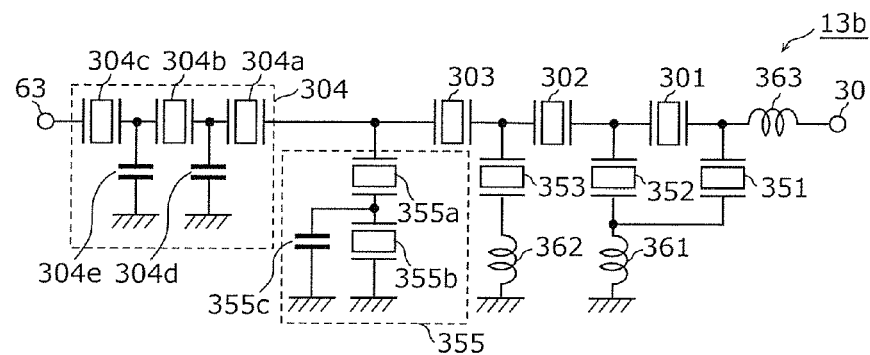
FIG. 10 is a circuit diagram of a transmission-side filter of Band66 that is included in a multiplexer according to a second modification to the first preferred embodiment of the present invention.

FIG. 10 is a circuit diagram of a transmission-side filter 13b of Band66 that is included in a multiplexer according to a second modification to the first preferred embodiment. The multiplexer according to the present modification differs from the multiplexer 1 according to the first preferred embodiment in that, in the transmission-side filter 13b, the parallel arm resonator 355 closest to the common connection terminal 50 includes the resonators and the capacitance element in addition to the series arm resonator 304 closest to the common connection terminal 50.

As shown in FIG. 10, the transmission-side filter 13b includes the series arm resonators 301 to 304, the parallel arm resonators 351 to 353 and 355, and the inductance elements 361 to 363 to provide matching.

The structures of the series arm resonators 301 to 303, the parallel arm resonators 351 to 353, and the inductance elements 361 to 363 are the same or substantially the same as those of the series arm resonators 301 to 303, the parallel arm resonators 351 to 353, and the inductance elements 361 to 363 described according to the first preferred embodiment. The structure of the series arm resonator 304 is the same or substantially the same as that of the series arm resonator 304 according to the first preferred embodiment. The structure of the parallel arm resonator 355 is the same or substantially the same as that of the parallel arm resonator 355 according to the first modification to the first preferred embodiment. According to the second modification of the first preferred embodiment, the capacitance elements 304d, 304e, and 355c are the first capacitance elements.

With this structure, the bandpass characteristic of the reception-side filter 14 can be reduced or prevented from being degraded, and the loss in the pass band of the transmission-side filter 13b is not increased as in the multiplexer 1 according to the first preferred embodiment. Accordingly, the bandpass characteristic of the multiplexer can be reduced or prevented from being degraded.

Second Preferred Embodiment

Figure 11:
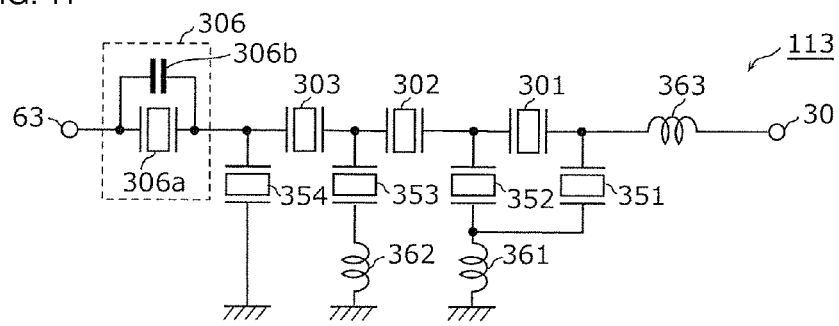
FIG. 11 is a circuit diagram of a transmission-side filter of Band66 that is included in a multiplexer according to a second preferred embodiment of the present invention.

A multiplexer according to a second preferred embodiment of the present invention is described below. FIG. 11 is a circuit diagram of a transmission-side filter 113 of Band66 that is included in a multiplexer according to the second preferred embodiment.

The multiplexer according to the second preferred embodiment differs from the multiplexer 1 according to the first preferred embodiment in that the structure of the series arm resonator that is electrically connected at a position closest to the common connection terminal 50 in the transmission-side filter 113 of Band66 differs from that of the transmission-side filter 13 according to the first preferred embodiment. In the multiplexer according to the second preferred embodiment, the transmission-side filter 113 of Band66 is a third acoustic wave filter, and the reception-side filter 14 of Band66 is a fourth acoustic wave filter.

As shown in FIG. 11, the transmission-side filter 113 includes the series arm resonators 301 to 303, a series arm resonator 306, the parallel arm resonators 351 to 354, and the inductance elements 361 to 363 to provide matching.

The structures of the series arm resonators 301 to 303, the parallel arm resonators 351 to 354, and the inductance elements 361 to 363 are the same or substantially the same as those of the series arm resonators 301 to 303, the parallel arm resonators 351 to 354, and the inductance elements 361 to 363 according to the first preferred embodiment.

The series arm resonator 306 includes a resonator 306a and a capacitance element 306b. The resonator 306a is electrically connected in series with the series arm resonator 303 to a signal path electrically connecting the series arm resonator 303 and the transmission output terminal 63 to each other. The resonator 306a is preferably a surface acoustic wave resonator and has the same or substantially the same structure as each resonator 100 described above. The capacitance element 306b is electrically connected in series with the series arm resonator 303 and in parallel with the resonator 306a to the signal path electrically connecting the series arm resonator 303 and the transmission output terminal 63 to each other. Specifically, the capacitance element 306b is electrically connected in parallel with the resonator 306a to bridge both end portions of the resonator 306a, that is, to bridge the input port side and the output port side of the resonator 306a. The capacitance element 306b has the same or substantially the same structure as the capacitance elements 304d and 304e described according to the first preferred embodiment. According to the second preferred embodiment, the capacitance element 306b is a second capacitance element.

The radio-frequency transmission characteristics of the multiplexer according to the second preferred embodiment will now be described and compared with the radio-frequency transmission characteristics of the multiplexer in the comparative example. The multiplexer in the comparative example includes the transmission-side filter 73 shown in FIG. 6 as the transmission-side filter of Band66. The transmission-side filter 113 that has a similar structure to the transmission-side filter 73 also has a problem in that a spurious wave is emitted at a frequency that is in the pass band of the reception-side filter 14 of Band66 as in the transmission-side filter 73. However, the transmission-side filter 113 can reduce the effect of the spurious wave as described below.

Figure 12A:
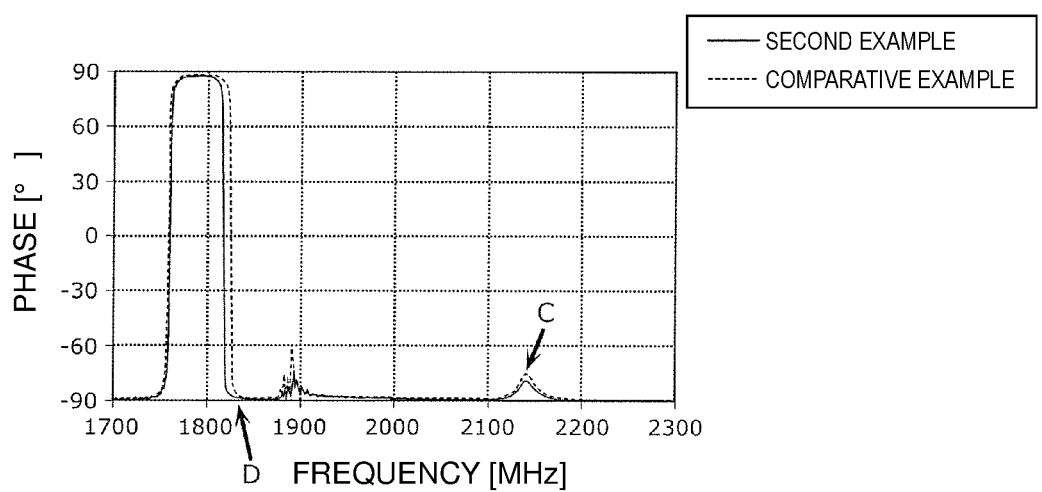
FIG. 12A is a graph in which the phase of a series arm resonator closest to a common connection terminal in the transmission-side filter of Band66 is compared between the second preferred embodiment of the present invention and the comparative example.
Figure 12B:
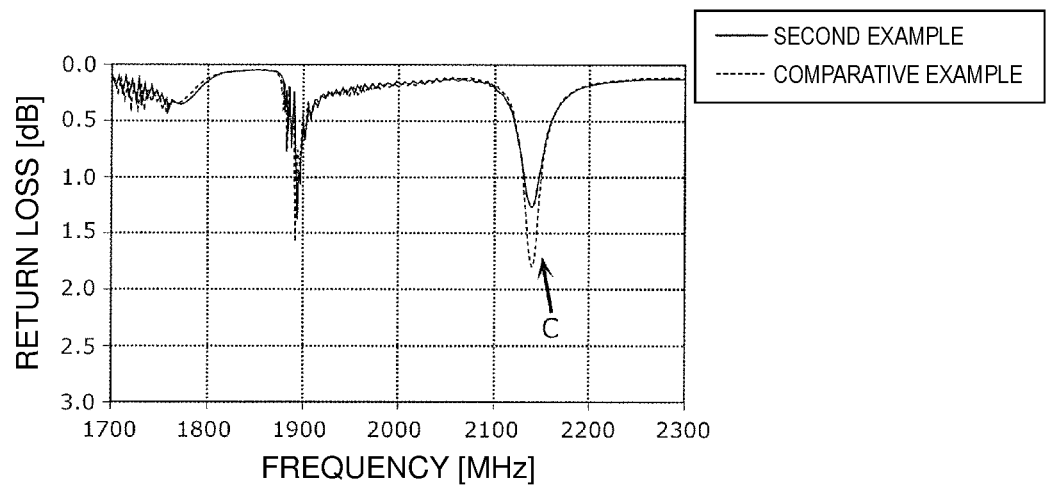
FIG. 12B is a graph in which the return loss of the series arm resonator closest to the common connection terminal in the transmission-side filter of Band66 is compared between the second preferred embodiment of the present invention and the comparative example.

FIG. 12A is a graph in which the phases of the series arm resonators 306 and 305 according to the second preferred embodiment and the comparative example are compared. FIG. 12B is a graph in which the return losses of the series arm resonators 306 and 305 according to the second preferred embodiment and the comparative example are compared. In FIGS. 12A and 12B, the result of the series arm resonator 306 of the transmission-side filter 113 according to the second preferred embodiment is shown as a second example, and the result of the series arm resonator 305 in the comparative example is shown as the comparative example.

As shown by an arrow C in FIG. 12A, both of the phases in the second example and the comparative example have a local maximum point due to the higher-order mode spurious wave of the series arm resonator 306 at or in a vicinity of about 2140 MHz that is in the pass band of the reception-side filter 14. The variation in the phase of the series arm resonator 306 in the second example is smaller than that of the series arm resonator 305 in the comparative example.

Similarly, as shown by an arrow C in FIG. 12B, both of the return losses in the second example and the comparative example have a local minimum point due to the higher-order mode spurious wave of the series arm resonator 306 at or in a vicinity of about 2140 MHz that is in the pass band of the reception-side filter 14. The return loss of the series arm resonator 306 in the second example is lower than that of the series arm resonator 305 in the comparative example. The use of the series arm resonator 306 instead of the series arm resonator 305 decreases the resonant fractional bandwidth in the higher-order mode of the series arm resonator 306. Consequently, the return loss of the series arm resonator 306 decreases. Accordingly, the effect of the higher-order mode spurious wave of the series arm resonator 306 on the reception-side filter 14 is reduced, and the bandpass characteristic of the reception-side filter 14 is reduced or prevented from being degraded.

When the structure of the series arm resonator closest to the common connection terminal 50 is the same or substantially the same as that of the series arm resonator 306 in the transmission-side filter 113, as shown by an arrow D in FIG. 12A, it can be seen that the resonant fractional bandwidth at a frequency in the main mode of the resonant frequency decreases at or in a vicinity of about 1820 MHz, which is in the main mode of the resonant frequency of the series arm resonator 306. However, the bandpass characteristic of the transmission-side filter 113 can be reduced or prevented from being degraded by adjusting the resonator parameters of not only the series arm resonator 306 but also each resonator 100 that is included in the series arm resonators 301 to 303 as in the transmission-side filter 13 according to the first preferred embodiment. Consequently, the bandpass characteristic of the reception-side filter 14 can be reduced or prevented from being degraded, and the bandpass characteristic of the transmission-side filter 113 is not degraded.

In the transmission-side filter 113 shown in FIG. 11, the series arm resonator 306 closest to the common connection terminal 50 includes the resonator 306a and the capacitance element 306b. The present invention, however, is not limited thereto. The parallel arm resonator 354 closest to the common connection terminal 50 may include a resonator and a capacitance element that is electrically connected in parallel with the resonator. More specifically, in the parallel arm resonator 354, the resonator may be electrically connected between a signal path electrically connecting the series arm resonators 306 and 303 to each other and the ground, and the capacitance element may be electrically connected to both sides of the resonator in parallel with the resonator. In this case, the transmission-side filter 113 may not include the series arm resonator 306 or the series arm resonator 306 may include the single resonator 100.

A preferred embodiment of the quadplexer is described above by way of example to describe the multiplexers according to preferred embodiments of the present invention. The present invention, however, is not limited to the above preferred embodiments. For example, the present invention includes the following modifications to the above preferred embodiments.

For example, the number of the resonators that are included in the series arm resonator closest to the common connection terminal is not limited to three as in the first preferred embodiment, and at least one resonator suffices. A capacitance element may be electrically connected between a signal path electrically connecting two resonators to each other and the reference terminal as in the first preferred embodiment or may be electrically connected in parallel with a single resonator to both sides of the resonator as in the second preferred embodiment.

The resonator parameters of the resonators that are included in the series arm resonators and the parallel arm resonators may be appropriately changed.

Each capacitance element may be an interdigitation capacitance or another element. For example, the capacitance element may be defined by a wiring line that is electrically connected to the reference terminal being provided adjacent to or in a vicinity of a wiring line that electrically connects two resonators. A mounting substrate on which the transmission-side filter is mounted may include the capacitance element.

The multilayer structure, the material, the Cut-Angles, and the thickness of the piezoelectric film included in the piezoelectric substrate included in each resonator and the piezoelectric substrate may be appropriately changed in accordance with the bandpass characteristic of the acoustic wave filter device.

A multiplexer according to a preferred embodiment of the present invention may include the inductance element 31 that is electrically connected between the signal path electrically connecting the antenna element and the common connection terminal to each other and the ground as described above or the inductance element 31 that is electrically connected in series with the signal path electrically connecting the antenna element and the common connection terminal to each other. For example, a multiplexer according to a preferred embodiment of the present invention may include a radio-frequency substrate on which acoustic wave filters having the above features and the inductance elements 21 and 31 on chips are mounted. The inductance elements 21 and 31 may be, for example, chip inductors or may be formed by a conductive pattern on a radio-frequency substrate. A multiplexer according to a preferred embodiment of the present invention may not include the inductance element 31.

Multiplexers according to preferred embodiments of the present invention are not limited to the quadplexers of Band25 and Band66 according to the preferred embodiments described above.

For example, a multiplexer according to a preferred embodiment of the present invention may be a hexaplexer having six frequency bands that is used in a system having a combination of Band25, Band66, and Band30 including a transmission band and a reception band. In this case, for example, the inductance element 21 is electrically connected in series with a reception-side filter of Band25, and a parallel arm resonator is electrically connected to the reception input terminal of the reception-side filter of Band25. In addition, a series arm resonator is electrically connected to terminals of five filters other than the reception-side filter of Band25 that are electrically connected to the common connection terminal, and the parallel arm resonator is not electrically connected thereto.

A multiplexer according to a preferred embodiment of the present invention may be a hexaplexer having six frequency bands that is used in a system having a combination of Band1, Band3, and Band7 including a transmission band and a reception band. In this case, for example, the inductance element 21 is electrically connected in series with a reception-side filter of Band1, and a parallel arm resonator is electrically connected to the reception input terminal of the reception-side filter of Band1. In addition, a series arm resonator is electrically connected to terminals of five filters other than the reception-side filter of Band1 that are electrically connected to the common connection terminal, and the parallel arm resonator is not electrically connected thereto.

A multiplexer according to a preferred embodiment of the present invention can decrease or prevent the insertion loss in the pass band more than a multiplexer that uses an existing matching method, and the insertion loss is more effectively decreased as the number of the acoustic wave filters thereof increases.

A multiplexer according to a preferred embodiment of the present invention may not include the duplexers that provide transmission and reception. The multiplexer may be used, for example, as a transmitting device having transmission frequency bands, or a receiving device having reception frequency bands. The transmitting device and the receiving device with the above structure provide the same or substantially the same advantageous effects as in the multiplexer 1 according to the present preferred embodiment.

According to the above preferred embodiments, the surface acoustic wave filters including the interdigital transducer electrodes are described by way of example as the transmission-side filters and the reception-side filters that are included in the multiplexers, the quadplexers, the transmitting device, or the receiving device. However, filters that are included in a multiplexer, a quadplexer, a transmitting device, or a receiving device according to the preferred embodiments of the present invention may be acoustic wave filters that use, for example, boundary acoustic waves and BAW (Bulk Acoustic Wave) and that include series arm resonators and parallel arm resonators. This also provides the same or substantially the same advantageous effects as in the multiplexers, the quadplexers, the transmitting device, or the receiving device according to the above preferred embodiments.

In the multiplexer 1 according to the above preferred embodiment, the inductance element 21 is electrically connected in series with the reception-side filter 12. However, according to a preferred embodiment of the present invention, the inductance element 21 may be electrically connected in series with the transmission-side filters 11 and 13 or the reception-side filter 14. According to a preferred embodiment of the present invention, the inductance element 21 may not be provided. Accordingly, a multiplexer having a low loss is able to be provided even when the number of the bands and the modes to be supported is increased.

Preferred embodiments of the present invention can be widely used, for example, as a multiplexer, a transmitting device, and a receiving device that have a low loss and that support a multi-band and multi-mode frequency standard in communication equipment, for example, a cellular phone.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer that transmits and receives radio-frequency signals via an antenna element, the multiplexer comprising:
   a plurality of acoustic wave filters that are electrically connected to a common connection terminal electrically connected to the antenna element and that have respective pass bands different from each other; wherein
   a first acoustic wave filter of the plurality of acoustic wave filters includes an input terminal, an output terminal, and at least one of a series arm resonator that is provided on a signal path electrically connecting the input terminal and the output terminal to each other and a parallel arm resonator that is electrically connected between the signal path and a reference terminal; and
   at least one of the series arm resonator closest to the common connection terminal and the parallel arm resonator closest to the common connection terminal includes two acoustic wave resonators that are electrically connected in series, and a first capacitance element that is electrically connected directly between a path electrically connecting the two acoustic wave resonators to each other and the reference terminal, the two acoustic wave resonators of the series arm resonator being the closest to the common connection terminal among acoustic wave resonators of the series arm resonator.

2. The multiplexer according to claim 1, wherein the first acoustic wave filter emits a spurious wave at a frequency that is in a pass band of a second acoustic wave filter of the plurality of acoustic wave filters that differs from the first acoustic wave filter.

3. The multiplexer according to claim 1, wherein the plurality of acoustic wave resonators have a same resonator parameter or substantially a same resonator parameter.

4. The multiplexer according to claim 1, wherein a piezoelectric substrate included in the first acoustic wave filter includes a piezoelectric film including a surface on which an interdigital transducer electrode is provided, a high acoustic velocity support substrate through which a bulk wave is transmitted at an acoustic velocity higher than an acoustic velocity at which an acoustic wave is transmitted through the piezoelectric film, and a low acoustic velocity film that is provided between the high acoustic velocity support substrate and the piezoelectric film and through which a bulk wave is transmitted at an acoustic velocity lower than an acoustic velocity at which a bulk wave is transmitted through the piezoelectric film.

5. The multiplexer according to claim 4, wherein the interdigital transducer electrode includes electrode fingers that are parallel or substantially parallel with each other, and a busbar electrode that connects the electrode fingers to each other.

6. The multiplexer according to claim 4, wherein
   the interdigital transducer electrode is defined by a main electrode layer; and
   the main electrode layer is adhered to the piezoelectric film by a close-contact layer.

7. The multiplexer according to claim 4, wherein a protective layer covers the main electrode layer.

8. The multiplexer according to claim 1, wherein a piezoelectric substrate included in the first acoustic wave filter is made of a $LiNbO_3$ piezoelectric single crystal substrate including a surface on which an interdigital transducer electrode is provided.

9. The multiplexer according to claim 1, wherein the first acoustic wave filter is a surface acoustic wave filter.

10. The multiplexer according to claim 1, wherein the plurality of acoustic wave filters include at least one transmission filter that filters a signal output to the common connection terminal and at least one reception filter that filters a signal received from the common connection terminal.

11. The multiplexer according to claim 1, further comprising an inductance element that is electrically connected in series between a signal path electrically connecting the common connection terminal and the antenna element and the reference terminal.

12. The multiplexer according to claim 1, wherein the first acoustic wave filter is an unbalanced-input-unbalanced-output band pass filter.

13. The multiplexer according to claim 1, wherein a piezoelectric substrate included in the first acoustic wave filter includes a support substrate, an energy-confining layer, and a piezoelectric film that are stacked in this order.

14. A multiplexer that transmits and receives radio-frequency signals via an antenna element, the multiplexer comprising:
- a plurality of acoustic wave filters that are electrically connected to a common connection terminal electrically connected to the antenna element and that have respective pass bands different from each other; wherein
- a third acoustic wave filter of the plurality of acoustic wave filters includes an input terminal, an output terminal, and at least one of a series arm resonator that is provided on a signal path electrically connecting the input terminal and the output terminal to each other, and a parallel arm resonator that is electrically connected between the signal path and a reference terminal; and
- at least one of the series arm resonator closest to the common connection terminal and the parallel arm resonator closest to the common connection terminal includes at least one acoustic wave resonator, and a second capacitance element that is electrically connected in parallel with the at least one acoustic wave resonator to bridge both end portions of the at least one acoustic wave resonator.

15. The multiplexer according to claim 14, wherein the third acoustic wave filter emits a spurious wave at a frequency that is in a pass band of a fourth acoustic wave filter of the plurality of acoustic wave filters that differs from the third acoustic wave filter.

16. The multiplexer according to claim 14, wherein a piezoelectric substrate included in the third acoustic wave filter includes a piezoelectric film including a surface on which an interdigital transducer electrode is provided, a high acoustic velocity support substrate through which a bulk wave is transmitted at an acoustic velocity higher than an acoustic velocity at which an acoustic wave is transmitted through the piezoelectric film, and a low acoustic velocity film that is provided between the high acoustic velocity support substrate and the piezoelectric film and through which a bulk wave is transmitted at an acoustic velocity lower than an acoustic velocity at which a bulk wave is transmitted through the piezoelectric film.

17. The multiplexer according to claim 14, wherein a piezoelectric substrate included in the third acoustic wave filter is made of a $LiNbO_3$ piezoelectric single crystal substrate including a surface on which an interdigital transducer electrode is provided.

18. The multiplexer according to claim 14, wherein the first acoustic wave filter is a surface acoustic wave filter.

19. The multiplexer according to claim 14, wherein the plurality of acoustic wave filters include at least one transmission filter that filters a signal output to the common connection terminal and at least one reception filter that filters a signal received from the common connection terminal.

20. The multiplexer according to claim 14, further comprising an inductance element that is electrically connected in series between a signal path electrically connecting the common connection terminal and the antenna element and the reference terminal.

* * * * *